United States Patent
Ha et al.

(10) Patent No.: US 12,253,799 B2
(45) Date of Patent: Mar. 18, 2025

(54) HIGH REFRACTIVE INDEX NANO-IMPRINT LITHOGRAPHY RESIN

(71) Applicant: Addison Clear Wave Coatings, Inc., St. Charles, IL (US)

(72) Inventors: Chau Ha, Glen Ellyn, IL (US); Martin Newcomb, Glen Ellyn, IL (US)

(73) Assignee: Addison Clear Wave Coatings, Inc., St. Charles, IL (US)

(*) Notice: Subject to any disclaimer, the term of this patent is extended or adjusted under 35 U.S.C. 154(b) by 174 days.

(21) Appl. No.: 18/100,695

(22) Filed: Jan. 24, 2023

(65) Prior Publication Data
US 2023/0236499 A1 Jul. 27, 2023

Related U.S. Application Data

(60) Provisional application No. 63/302,656, filed on Jan. 25, 2022.

(51) Int. Cl.
*G03F 7/20* (2006.01)
*C08K 3/22* (2006.01)
*G03F 7/00* (2006.01)

(52) U.S. Cl.
CPC .............. *G03F 7/0002* (2013.01); *C08K 3/22* (2013.01); *C08K 2003/2241* (2013.01); *C08K 2201/005* (2013.01); *C08K 2201/011* (2013.01)

(58) Field of Classification Search
CPC . G03F 7/0002; C08K 3/22; C08K 2003/2241; C08K 2201/005; C08K 2201/011; C08K 3/14; C08K 3/34
See application file for complete search history.

(56) References Cited

U.S. PATENT DOCUMENTS

| | | | |
|---|---|---|---|
| 8,592,511 B2 | 11/2013 | Gonen Williams et al. | |
| 9,359,689 B2 | 6/2016 | Xu et al. | |
| 10,273,365 B2 | 4/2019 | Xu et al. | |
| 10,753,012 B2 | 8/2020 | Xu et al. | |
| 2013/0221279 A1 | 8/2013 | Xu et al. | |
| 2014/0322549 A1 | 10/2014 | Xu et al. | |
| 2018/0079925 A1 | 3/2018 | Lyon et al. | |
| 2018/0223107 A1 | 8/2018 | Monickam et al. | |
| 2019/0055412 A1 | 2/2019 | Monickam et al. | |
| 2020/0087534 A1 | 3/2020 | Rahman et al. | |
| 2022/0002574 A1 | 1/2022 | Guschl et al. | |
| 2022/0017381 A1 | 1/2022 | Repac et al. | |
| 2022/0334475 A1 | 10/2022 | Konno et al. | |
| 2022/0373725 A1* | 11/2022 | Zhang | B05D 7/546 |

OTHER PUBLICATIONS

S.Y. Chou, P.R. Krauss, P.J. Renstom, "Science", 1996, vol. 272, pp. 85-87. The introduction of the term nanoimprint lithography (NIL) is attributed to this paper in "Science".

\* cited by examiner

*Primary Examiner* — Mesfin T Asfaw
(74) *Attorney, Agent, or Firm* — von Briesen & Roper, s.c.

(57) ABSTRACT

A photo nanoimprint lithography (P-NIL) resin is disclosed. The P-NIL resin comprises: a cross-linkable organic binder; solvent based inorganic nanoparticles dispersed in the P-NIL resin; and a solvent configured to be evaporated; the P-NIL resin having a viscosity in the range of 4,000 to 6,000 centipoise at 25° C. after the solvent is evaporated prior to curing the P-NIL resin; and the P-NIL resin having a refractive index of greater than 1.6 at 589 nm and glass transition temperature of greater than 50° C. after curing by a photo initiator.

20 Claims, 1 Drawing Sheet

1a    1b    1c    1d    1e

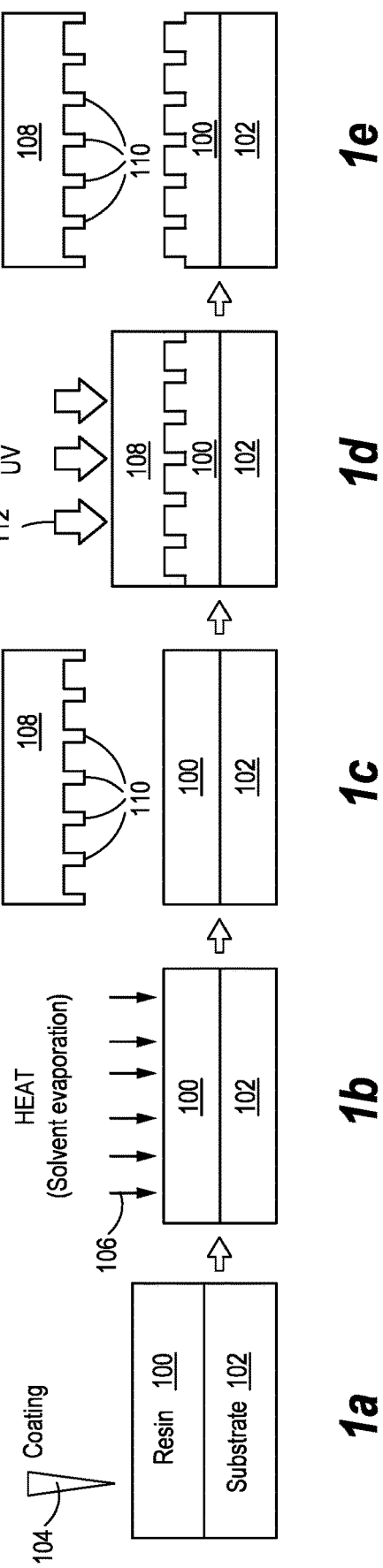

HIGH REFRACTIVE INDEX NANO-IMPRINT LITHOGRAPHY RESIN

CROSS-REFERENCE TO RELATED APPLICATION

This application is a Non-Provisional patent application claiming priority under 35 U.S.C. § 119(e) to U.S. Provisional Patent Application Ser. No. 63/302,656 filed on Jan. 25, 2022.

FIELD OF THE INVENTION

The invention relates to photo cure compositions for nanoimprint lithography (NIL) processes, and more specifically resins for use in nanometer scale structure patterning.

BACKGROUND

Nanoimprint lithography (NIL) is a technique for production of nanometer-sized features in materials. In one version of NIL, a curable resin, the imprint resin, is applied to a pattern or mold and cured by either heat or photolysis that initiates polymerization of the resin. The imprinted material is then removed from the mold, and the mold can be reused. In general, NIL methodologies offers a promise of low cost, short cycle time, and high yield manufacturing processes for sub-micrometer components of small devices.

When the imprint resin for NIL process is cured by photolysis, the technique is referred to as photo nanoimprint lithography (P-NIL) or UV nanoimprint lithography (UV-NIL). The term 2P (for photo polymer) refers to a similar technique employed at the micrometer or nanometer scale.

Photo nanoimprint lithography (P-NIL) or UV nanoimprint lithography (UV-NIL) is a cost-effective process used for mass production of optical, optoelectronic, or electronic components containing nanometer-sized features. A photopolymer (2P) resin is a light-sensitive, generally organic, material that may be used in a P-NIL process to form a patterned coating on a substrate.

In a general P-NIL process, a resin may be coated on a substrate such as glass or silicon. The resin may contain a solvent. If so, solvent removal is necessary and may be achieved by heating the resin on the substrate. A stamp or master template containing nanometer-sized features is pressed onto the resin. The resin is then cured via photolysis using ultraviolet (UV) or visible light. Afterwards, the stamp is removed to produce an embossed product. A high tensile strength and stiffness are important mechanical properties for a P-NIL or 2P resin. The absence of shrinkage during both a curing process and in a cured state is also an important property for a P-NIL/2P resin.

P-NIL processes are simpler than conventional hot embossing and injection molding techniques because P-NIL techniques may be accomplished at room temperature. P-NIL methods are especially attractive for high volume manufacturing of devices with nanometer (submicron) scale features because the cycle time can be very short; for example, the upper or second information layer of Blu-Ray® discs is created by P-NIL with a cycle time of only a few seconds. The rapid, precise, direct patterning and repeatable replication of complex nanometer scale patterns in a single step makes the technique compelling in comparison to expensive techniques such as e-beam or helium ion beam lithography. The versatility of the technique enables the fabrication of unique nanoscale devices by P-NIL for a variety of applications including optics, plasmonics, and even biotechnology. Recent advances in throughput and yield in P-NIL processes demonstrate the potential of being adopted for mainstream semiconductor device fabrication as well.

Applications of P-NIL are vast, ranging from flexible displays, wearable electronics, facial recognition, artificial intelligence, bio-medical, and semiconductor chips. Applications of P-NIL for fabrication of optical devices for augmented, virtual and mixed realities (AR/VR/MR), optical sensors for autonomous automotive applications, and bio-sensors are noteworthy. P-NIL methods can also be used for production of photonic and optical applications such as diffractive optical elements (DOE) including optical diffusers and waveguides that control the phase of transmitted light.

For optical applications, high refractive index (RI) materials are desired because they can provide thin lenses and increased field of view (FOV) in devices. In optics, the refractive index of a material describes how fast light travels through the material, and the RI of a lens will determine how much light is bent when passing through the lens. Today, glasses exist with refractive indices ranging up to 2.0 at 589 nm. However, when features are needed on the surface of the glass, etching a pattern on the glass is costly and time consuming. An alternative to etching the glass is to create surface features on a thin layer of polymeric material by NIL processes. Importantly, the cured resins used in these NIL processes must have refractive indices that match those of the glasses to reduce internal reflections, and, when there is a perfect match in refractive indices, there is no internal reflection or bending of light through the glass-film interface.

Conventional P-NIL resins are organic prepolymer formulations that typically have an RI of the cured material in the range 1.45-1.55 at 589 nm. An increase in the RI of the P-NIL resin material would allow device miniaturization, which is important for augmented reality, virtual reality, and mixed reality (AR/VR/MR) applications.

Others have attempted to increase the RI of a cured resin above 1.6. For example, US Patent Application 2022/0334475 discloses photocurable composition including metal oxide nanoparticles, a component (R) which is an unsaturated acid metal salt, a photopolymerizable compound excluding a compound corresponding to the component (R), and a photoradical polymerization initiator. As can be seen the prior art fails to provide a resin composition having an RI above 1.6 at 589 nm with a viscosity in the range of 4,000 to 6,000 centipoise.

It is thus desirable to utilize a P-NIL resin having a RI ranging from 1.6 to 2.0 at 589 nm with a viscosity in the range of 4,000 to 6,000 centipoise at 25° C.

SUMMARY OF THE DISCLOSURE

In one embodiment of the disclosure, a photo nanoimprint lithography (P-NIL) resin is disclosed. The P-NIL resin comprises: a cross-linkable organic binder; solvent based inorganic nanoparticles dispersed in the P-NIL resin; and a solvent configured to be evaporated; the P-NIL resin having a viscosity in the range of 4,000 to 6,000 centipoise at 25° C. after the solvent is evaporated prior to curing the P-NIL resin; and the P-NIL resin having a refractive index of greater than 1.6 at 589 nm and glass transition temperature of greater than 50° C. after curing by a photo initiator.

In another embodiment of the disclosure, a photo-polymer (2P) resin used in photo nanoimprint lithography for photonic and optical applications is disclosed. The 2P resin comprises: an organic compound; inorganic nanoparticles less than 30 nanometers in size; the organic compound having a minimum refractive index value of 1.5 and chosen from the group consisting of acrylate-based resin, epoxy-based resin, materials containing brominated aromatic compounds, and sulfur-containing compounds; the inorganic nanoparticles having a minimum refractive index value of 1.6 at 589 nm chosen from the group consisting of silicon carbide, silicon nitride, zinc oxide, zirconium oxide, and titanium oxide; wherein the organic compound and the inorganic nanoparticles are combined in a pre-polymerized liquid medium; and wherein after a curing process a resultant cured material has a refractive index greater than or equal to 1.65 at 589 nm and a glass transition temperature greater than or equal to 40° C.

In another embodiment of the disclosure, a method of producing a photo nanoimprint lithography (P-NIL) resin is disclosed. The method comprises: providing an uncured P-NIL resin consisting of a cross-linkable organic binder, solvent based inorganic nanoparticles dispersed in the uncured P-NIL resin, and a solvent having a viscosity in the range of 4,000 to 6,000 centipoise at 25° C.; coating the uncured P-NIL resin on a substrate; applying heat to the uncured P-NIL resin for solvent evaporation; stamping the uncured P-NIL resin with a stamp having nanometer sized features; curing the uncured P-NIL resin with a photo initiator; and removing the stamp wherein the resultant P-NIL resin has a refractive index of greater than 1.6 at 589 nm, a glass transition temperature of greater than 50° C., and nanometer sized features.

BRIEF DESCRIPTION OF THE DRAWINGS

FIG. 1 is a flow chart of the steps in a photo nanoimprint lithography process using the 2P resin of the present disclosure, according to an embodiment of the disclosure.

DETAILED DESCRIPTION OF THE DISCLOSURE

Referring now to the drawings, and with specific reference to the depicted P-NIL process illustrated in FIG. 1, a photo nanoimprint lithography (P-NIL) resin 100 having a high refractive index and high mechanical performance used in photo nanoimprint lithography (P-NIL) or UV nanoimprint lithography and the method of formulating the P-NIL resin 100 for P-NIL applications is disclosed herein. The P-NIL resin 100 may be a high refractive index organic/inorganic resins used for P-NIL applications. The P-NIL resin 100 may have substantially higher RI than conventional organic resins and exhibits acceptable mechanical or toughness performance properties. The P-NIL resin 100 may be formulated for use in photonic and optical applications such as optical diffusers and waveguides, and in AR/VR/MR devices. The P-NIL resin 100 may be referred to as a "2P resin," as generally known by a person having ordinary skill in the arts.

As shown in FIG. 1, a P-NIL process is illustrated using the P-NIL resin 100 disclosed herein. When conducting a P-NIL process, the P-NIL resin 100 is dispensed or "coated" on a substrate 102 via a coating device 104, as shown in FIG. 1a. The P-NIL resin 100 may contain an optional solvent. If the P-NIL resin 100 contains a solvent, the solvent may be removed by applying heat 106 to the P-NIL resin 100 for evaporating the solvent after coating on the substrate 102, as shown in FIG. 1B, and as generally known in the arts. A stamp 108, also referred to as a pattern, is then pressed into the P-NIL resin 100 as shown in FIGS. 1c-1d. The stamp 108 may include nanometer features 110 which get embossed on the P-NIL resin 100. As shown in FIG. 1d, the P-NIL resin 100 may be cured via photolysis 112 by using UV or visible light. Lastly, the stamp 108 is removed, as shown in FIG. 1e, resulting in the cured P-NIL resin 100 having the nanometer features 100 imprinted on the P-NIL resin 100.

In addition to being cured photochemically to give a film with a high refractive index, the P-NIL resin 100 must meet several conditions, and control of viscosity is critically important. The viscosity of the formulation must be low enough such that uniform ultra-thin coatings of 0.1 to 4 microns can be produced by, for example, spin coating. Achieving a low enough viscosity for ultra thin coating is obtained by adding solvent to the P-NIL resin 100. After removal of solvent, the hybrid resin must maintain enough fluidity such that it can fill the features of the stamp 108 (or mold) by capillary action which prevents unnecessary wear or damage to the stamp. The P-NIL resin 100 may contains the solvent to give viscosities of <500 cps prior to heating in FIG. 1b. After the solvent is removed the P-NIL resin 100 may have viscosities of <4000 cps which can fill features in molds or from the stamp 108 by capillary action. The P-NIL resin 100 may be capable of being imprinted to accurately capture the nanometer features 110 and that the cured P-NIL resin 100 forming a thin cured film on the substrate 102 is strong enough to maintain the nanometer features 110 when the stamp 108 is removed from the cured film and when the component or assembled device is heated in subsequent processing and/or operation.

In addition, the cured resins must be able to meet industrial level testing requirements such as 85° C. and 85% humidity for 1,000 hours without significant deterioration. Finally, for optical applications such as those noted in the background, the refractive indices of the cured resins must be >1.6 at 589 nm, and for many AR/VR/MR applications, >1.7 at 589 nm for achieving a wide field of view (FOV).

In one embodiment, the P-NIL resin 100 comprises an organic compound or organic binder and inorganic nanoparticles mixed together in a pre-polymerized liquid medium. The P-NIL resin 100 comprising both an organic compound and inorganic nanoparticles can be used at room temperature in the P-NIL technique to maintain a high RI value and maintain excellent mechanical properties, such as a glass transition temperature. The increased RI of the P-NIL resin 100 will allow device miniaturization in photonic and optical application such as in optical diffusers, waveguides, and optical elements for AR/VR/MR applications For the P-NIL resin 100 to be useful and practical in real life applications of AR/VR/MR and optical sensors, the P-NIL resin 100 must meet three requirements. Requirement 1: The P-NIL resin 100 must have good fluidity for the imprint process of thin layer nano structures (10 to 4000 nm). The viscosity of the organic binder must be 10-5,000 cps, and the viscosity of the P-NIL resin 100 must be 50-6,000 cps. Requirement 2: The P-NIL resin 100 must be mechanically robust to offer high reliability for the use of the optical devices. Requirement 3: The inorganic nano particles in the P-NIL resin 100 must have particle sizes of <50 nm for achieving high optical transmission, high clarity, and low haze.

The organic compound may be chosen from the group consisting of acrylate-based resins, epoxy-based resins, brominated aromatic compound, sulfur-containing compounds or another organic compound with an RI value greater than 1.5 at 589 nm.

The inorganic nanoparticles of the P-NIL resin 100 are nanometer-sized particles having a high RI value. The inorganic nanoparticles may be chosen from materials such as, but not limited to, silicon carbide (SiC), silicon nitride ($Si_3N_4$), zinc oxide (ZnO), zirconium oxide (zirconia, $ZrO_2$) and titanium oxide (titania, $TiO_2$). In order to avoid light scattering and maintain clarity of the formulations, these particles should be less than 50 nm, or less than 30 nm, and also have a high RI value greater than 1.6 at 589 nm.

In addition, in order to avoid agglomeration of the inorganic nanoparticles in the pre-polymerized liquid medium with the organic compound, the inorganic nanoparticles may be functionalized or capped by an organic coating layer that can be dispersed evenly or chemically bonded to the organic compound of the P-NIL resin 100. Many types of high RI inorganic nanoparticles are available in small size and with organic coatings, as generally known in the arts. For example, zirconium oxide and titanium oxide particles in the size range 10-20 nm and coated with an organic layer are commercially available.

In addition to these two types of inorganic materials, other high RI inorganic materials that are sized in the range of 5-50 nm, but do not contain an organic layer are commercially available, which may be capped or coated with an organic layer using conventional functionalization chemistry, as generally known in the arts. Acceptable organic layers include, but are not limited to, silane capping agents, carboxylic acid capping agents, waxes, and amines.

In one embodiment, the P-NIL resin 100 is formulated by beginning with a relatively high RI organic resin, such as an organic resin having a refractive index greater than 1.52 at 589 nm that displays excellent mechanical performance properties. After, the inorganic nanoparticles with a high RI are added to form a hybrid organic/inorganic resin as the P-NIL resin 100. The cured P-NIL resin 100 then obtains a high RI while maintaining acceptable mechanical performance.

As shown in FIG. 1, the P-NIL resin 100 may be used in P-NIL techniques for use in diffractive optical elements (DOE) including optical diffusers and waveguides that control the phase of transmitted light and optical elements for AR/VR/MR devices. The P-NIL resin 100 may be coated on a substrate 102 made of glass, silicon, or the like, and a stamp 108, or master template, containing nanometer features 110 is then pressed onto the P-NIL resin 100. After, the P-NIL resin 100 is cured with UV or visible light and the stamp 108 is then removed to emboss the nanometer features 100 on the cured P-NIL resin 100 having a high RI and acceptable mechanical properties.

As noted above, simply obtaining high RI in a material does not necessarily make it suitable for P-NIL applications. The physical mechanical and toughness properties of the high RI materials must be controlled by design. For example, the high RI of P-NIL/2P resins should have high clarity in the visible spectrum obtained by the absence of absorbances and low haze from light scattering. The P-NIL resin 100 must also display limited shrinkage during the curing process. The cured P-NIL resin 100 must adhere to the surface of a robust material such as glass or a silicon wafer and detach from the surface of the mold or working stamp 108. The cured P-NIL resin 100 must be strong enough such that it does not tear apart when handled and rigid enough such that the nanometer features 110 from the stamp 110 do not deform. Importantly, the glass transition temperature (Tg) of the cured P-NIL resin 100 should be high enough such that deformation and excessive thermal expansion does not occur under normal operating conditions.

For achieving the desired properties, photo-cure acrylates or photo-cure epoxies can be used as components of the organic binders. Details of photo cure acrylates and photo cure epoxy organic binders are described below.

Photo-Cure Acrylate Organic Binders:

To design a photo-cure acrylate (or methacrylate) organic binders to meet the required properties, four "acrylate components" may be used. The First Acrylate Component should be one or more low viscosity monomer(s) may be used as a diluent for viscosity control. Aliphatic or aromatic monomers can be used as a viscosity dilution aid, but an aromatic monomer is desirable to ensure that a high refractive index organic binder is obtained. The Second Acrylate Component should be a multifunctional acrylate or methacrylate monomer(s) or oligomer(s) to provide high crosslink density and high Tg in the final cured film. The Third Acrylate Component should be one or more adhesion promotor agents are used to ensure good adhesion and high reliability of the final cured film. The Fourth Acrylate Component should be one or more photo initiator(s) with activation wavelengths in the range of 300 to 500 nm.

First Acrylate Component: It is desirable to use mono-, di- or tri-acrylates that have low viscosity. Specific examples of mono-, or di-acrylate monomers include, but are not limited to, the following: Neopentyl diacrylate, Isobornyl acrylate, diacrylate of hydroxypivalaldehyde modified trimethylolpropane, hydroxyl pivalic acid neopentyl glycol diacrylate, diacrylate of tricyclodecane dimethanol, cyclohexane dimethanol dimethacrylate, ethoxylated bisphenol-A diacrylate, tripropylene glycol diacrylate, triethylene glycol diacrylate, 1,3-butylene glycol dimethacrylate, dimethacrylate of ethylene oxide modified bisphenol-A, t-butyl methacrylate, PEG #200 diacrylate, 3-methyl-1.5-pentanediol diacrylate, 2-butyl-2-ethyl-1.3-propanediol diacrylate, 2-methyl-1.8-octanediol-diacrylate, 1.9-nonanediol diacrylate, or the likes. It is desirable to use high refractive index monomers for arriving to an organic binder that has high refractive index, so that the amount of high refractive index inorganic particles can be kept at minimum for achieving high fluidity. The desirable monomers have refractive indices of the homopolymer films in the range of 1.51 to 1.58 at 589 nm. Examples of such types high refractive index monomers are listed in Table 1.

TABLE 1

High refractive monomers with low viscosity

| Chemical Name | Viscosity (cps, 25° C.) | RI* @ 589 nm at 25° C. |
|---|---|---|
| 2-ethoxylated phenol acrylate | 20 | 1.510 |
| Benzyl acrylate | 5 | 1.514 |
| 1-ethoxylated phenol acrylate | 20 | 1.516 |
| Bisphenol A ethoxylated acrylate | 700 | 1.516 |
| Phenylthioethyl acrylate | 15 | 1.560 |
| Phenoxy Benzyl acrylate | 20 | 1.565 |
| 1-Ethoxylated-o-phenylphenol acrylate | 130 | 1.577 |

*RI = refractive index of the cured homopolymer.

Second Acrylate Component: For achieving glass transition temperatures of the cured film of >50° C., multifunctional acrylate or methacrylate monomers or oligomers are used. This results in high crosslink density in the cured film and Tg>50° C. Examples of multifunctional acrylates include but are not limited to trimethylolpropane tri(meth) acrylate, tris(2-hydroxyethyl) isocyanurate triacrylate, ethoxylated trimethylolpropane triacrylate, pentaerythritol tetraacrylate, di(trimethylolpropane) tetraacrylate, dipentaerythritol pentaacrylate, trimethylolpropane triacrylate, or the likes. The multi-functional acrylate monomer(s) or oligomer(s) can be selected from high refractive index types of resins including but not limited to bisphenol-A epoxy di-triacrylates, 9,9-bis[4-(2-acryloyloxyalkoxy)phenyl]fluorene di-acrylate. Typically, the multi-functional acrylates have high viscosity. The percentage of multi-functional acrylates used in PNIL-R compositions must be optimized for achieving adequate fluidity for the imprint process.

Third Acrylate Component: Adhesion promotors are used as chelating agents to gain strong bonding to the base substrate and to provide high reliability performances for the patterned cured P-NIL resin. The following types of chelating agents have been found to be effective: carboxylic type acids, phosphoric type of acids, metal hybrid acrylates, silane coupling agents, basic types of adhesion promotor agents including amine or amide based adhesion promoters including amine based acrylate. Examples of specific chelating agents are (but are not limited to) the following: amine acrylates including CN 373, CN 984, CN 384, CN 386, and CN 371, SR 368 from Arkema Sartomer, dimethylaminoethyl methacrylate from Kyoeisha; acid based chelating agents such as phosphate of caprolactone modified 2-hydroxyethyl methacrylate, phosphate of 2-hydroxyethylmethacrylate from Nippon Kayaku Co. Ltd., 2-methacryloyloxyethyl acid phosphate, 2-methacryloyloxyethyl succinic acid, 2-methacryloyloxyethyl hexahydrophthalate, 2-acryloyloxyethyl succinate, 2-acryloyloxyethyl phthalate, 2-acryloyloxyethyl phosphate, 2-acryloyloxyethyl phosphate diacrylate, 2-acryolyoxyethyl hexahydro phthalate from Kyoeisha; silane chelating agents including gamma-mercaptopropyltrimethoxysilane, gamma-glycidoxypropyltrimethoxysilane, N-(beta-aminoethyl)-gamma-aminopropyltrimethoxysilane, gamma-methacryloxypropyltrimethoxysilane from SOI Specialties.

Fourth Acrylate Component: Both short wavelength and long wavelength radical inducing photo initiators can be used. The selection of short wavelength or long wavelength radical inducing photo initiators are based on the UV light sources used in the NIL process. Examples of short wavelength radical inducing photo initiators include, but are not limited to: benzophenone, 2-hydroxy-2-methyl phenylpropane-1-one (Irgacure 1173 from BASF), 1-hydroxycyclohexyl phenyl-ketone (Irgacure 184 from BASF). Long wavelength radical inducing photo initiators are but not limited to diphenyl (2,4,6-trimethylbenzoyl)-phosphine oxide (Darocure TPO from BASF), phosphine oxide, phenyl bis (2,4,6-trimethylbenzoyl)-phosphine oxide (Irgacure 819, BASF), 1,2-diphenyl-2,2-dimethoxyethanone (Irgacure 651, BASF).

Examples of photo cure acrylate organic binders are listed below.

Photo Cure Acrylate Example 1

| Ingredients | Fraction |
| --- | --- |
| Epoxy diacrylate CN-104 from Arkema | 0.23 |
| Ethoxylated bisphenol A diacrylate | 0.25 |
| 2-ethoxylated phenol acrylate | 0.25 |
| 1-Ethoxylated-o-phenylphenol acrylate | 0.239 |
| gamma-methacryloxypropyltrimethoxy silane | 0.001 |
| 2-hydroxy-2-methyl-1-phenyl-propane-1-one | 0.03 |
| Formulation results | |
| Viscosity, cps @ 25° C. | 350 |
| Refractive index of cured resin (589 nm, 25° C.) | 1.57 |
| Glass transition temperature of the cured resin, Tg (° C.) | 70 |

Photo Cure Acrylate Example 2

| Ingredients | Fraction |
| --- | --- |
| Epoxy diacrylate CN-104 from Arkema | 0.45 |
| Isobornyl acrylate | 0.30 |
| Phenoxy Benzyl acrylate | 0.10 |
| 1-Ethoxylated-o-phenylphenol acrylate | 0.099 |
| gamma-methacryloxypropyltrimethoxysilane | 0.001 |
| 1-hydroxycyclohexyl phenyl-ketone | 0.05 |
| Formulation results | |
| Viscosity, cps @ 25° C. | 700 |
| Refractive index of cured resin (589 nm, 25° C.) | 1.57 |
| Glass transition temperature of cured resin, Tg (° C.) | 90 |

Photo Cure Acrylate Example 3

| Ingredients | Fraction |
| --- | --- |
| Ethoxylated bisphenol A diacrylate | 0.25 |
| Isobornyl acrylate | 0.15 |
| Phenoxy Benzyl acrylate | 0.20 |
| 1-Ethoxylated-o-phenylphenol acrylate | 0.349 |
| gamma-mercaptopropyltrimethoxy | 0.001 |
| 1-hydroxycyclohexyl phenyl-ketone | 0.02 |
| 1,2-Diphenyl-2,2-dimethoxyethanone | 0.03 |
| Formulation results: | |
| Viscosity, cps @ 25° C. | 155 |
| Refractive index of cured resin (589 nm, 25° C.) | 1.57 |
| Glass transition temperature of cured resin, Tg (° C.) | 60 |

Photo-Cure Epoxy Organic Binders:

Photo-cure epoxy organic binders comprise three "epoxy" components: Component 1: polymerizable epoxides or oxetanes; Component 2: silane coupling agent(s); and Component 3: photo-acid-generators (PAGs).

Epoxy Component 1: The polymerizable epoxides or oxetanes may be commercially available or prepared synthetically. Non-limiting examples of suitable commercially available epoxide compounds include 3,4-epoxycyclohexylmethyl-3',4'-epoxycyclohexancarboxylate, the diglycidyl ester of hexahydrophthalic acid, 2,2-bis[4-(glycidyloxy) phenyl]propane, bisphenol A diglycidyl ether, and bisphenol F diglycidyl ether, among others.

Epoxy Component 2: Because photo cure epoxy binders are polymerized using cationic pathways, it is required that the silane coupling agents are not basic in nature. The most desirable silane coupling agents are epoxy functional silanes. Examples of epoxy functional silanes include but are not limited to 3-glycidoxypropyl methyldimethoxysilane (KBM-402 from Shin Etsu), 3-glycidoxypropyl trimethoxysilane (KBM-403 from Shin Etsu), 3-glycidoxypropyl methyldiethoxysilane (KBE-402 from Shin Etsu), 3-glycidoxypropyl triethoxysilane (KBE-403 from Shin Etsu).

Epoxy Component 3: The photo-acid-generators (PAGs) induce acid-catalyzed polymerization of the polymerizable epoxides/oxetanes by forming a super-acid when exposed to UV or visible light. Suitable PAGs may be selected from known photochemically active "onium" salts (e.g., sulfoniums, iodoniums, etc.) as well as neutral compounds (e.g., sulfonate esters) that react in the presence of UV light to generate a super-acid that induces acid-catalyzed polymerization of the polymerizable epoxides/oxetanes. As is understood by those with ordinary skill in the art, a super-acid is an acid that has an acidity that is greater than that of 100% sulfuric acid. For example, the PAG may be a sulfonium salt having a counterion that becomes protonated upon UV light exposure to form a super-acid. Alternatively, the PAG may be a sulfonate ester that hydrolyzes when exposed to UV light to form a super-acid. In particular, the super-acids generated by the PAGs may include a conjugate base that does not bind a proton well such as hexafluorophosphate, hexafluoroantimonate, sulfonate, and tetrakis(pentafluorophenyl)borate, among others. In this regard, of particular interest are commercially available PAGs that react in the presence of 365 nm light including diphenyl[4-(phenylthio)phenyl]sulfonium hexafluoroantimonate, diphenyl[4-(phenylthio)phenyl]sulfonium hexafluorophosphate, a mixture of diphenyl[4-(phenylthio)phenyl]sulfonium bis(heptafluoropropyl)tetrafluorophosphate and diphenyl[4-(phenylthio)phenyl]sulfonium tris(heptafluoropropyl)trifluorophosphate, a mixture of diphenyl[4-(phenylthio)phenyl]sulfonium hexafluoroantimonate and bis(4-diphenylthiophenyl)sulfide bis(hexafluoroantimonate), a mixture of diphenyl[4-(phenylthio)phenyl]sulfonium hexafluorophosphate and bis(4-diphenylthiophenyl)sulfide bis(hexafluorophosphate), tris[4-(4-acetylphenylthio)phenyl]sulfonium tetrakis(pentafluorophenyl)borate, tris[4-(4-acetylphenylthio)phenyl]sulfonium tris(trifluoromethylsulfonyl)methide, and (2-methylphenyl)-2-[[[(4-methylphenyl)sulfonyl]oxy]imino]-thiopheneacetonitrile.

Examples of photo cure epoxy binders are listed below.

Photo-Cure Epoxy Example 1

| Ingredients | Fraction |
| --- | --- |
| bisphenol-A diglycidyl ether | 0.50 |
| diglycidyl ester of hexahydrophthalic acid | 0.45 |
| 3-glycidoxypropyl methyldimethoxysilane | 0.03 |
| diphenyl[4-(phenylthio)phenyl]sulfonium hexafluoroantimonate | 0.02 |
| Formulation results: | |
| Viscosity, cps @ 25° C. | 350 |
| Refractive index of cured resin (589 nm, 25° C.) | 1.56 |
| Glass transition temperature of cured resin, Tg (° C.) | 100 |

Photo-Cure Epoxy Example 2

| Ingredients | Fraction |
| --- | --- |
| bisphenol-A diglycidyl ether | 0.65 |
| Liquid epoxy resin (DER 732, DOW) | 0.30 |
| 3-Glycidoxypropyl methyldimethoxysilane | 0.03 |
| diphenyl[4-(phenylthio)phenyl]sulfonium hexafluoroantimonate | 0.02 |
| Formulation results: | |
| Viscosity, cps @ 25° C. | 600 |
| Refractive index of cured resin (589 nm, 25° C.) | 1.57 |
| Glass transition temperature of cured resin, Tg (° C.) | 105 |

Photo Cure Epoxy Example 3

| Ingredients | Fraction |
| --- | --- |
| bisphenol-A diglycidyl ether | 0.60 |
| bisphenol F diglycidyl ether | 0.32 |
| 3-Glycidoxypropyl triethoxysilane | 0.05 |
| tris[4-(4-acetylphenylthio)phenyl]sulfonium tetrakis(pentafluorophenyl)borate | 0.03 |
| Formulation results: | |
| Viscosity, cps @ 25° C. | 900 |
| Refractive index of cured resin (589 nm, 25° C.) | 1.58 |
| Glass transition temperature of cured resin, Tg (° C.) | 140 |

For compiling photo nanoimprint lithography resin compositions, dispersions of high refractive index inorganic nanoparticles with sizes <50 nm are used. Inorganic dispersions in organic solvents (1-methoxy-2-propanol, propylene glycol methyl ether acetate, isopropyl alcohol, ethyl acetate, or n-butyl acetate or the likes) of high refractive index nano particles include, but are not limited to, $ZrO_2$ and $TiO_2$.

Commercially available $ZrO_2$, $TiO_2$ dispersions or the likes can be obtained from Pixelligent Technologies LLC (USA), Tayca Corporation (Japan), or Osaka Gas Chemicals (Japan). $TiO_2$ is used for achieving the optimum high refractive index because $TiO_2$ has higher refractive index than $ZrO_2$, but any type of inorganic dispersions that are compatible with the low viscosity high Tg photo-reactive organic binders may be utilized. For achieving RI values of 1.6 to 2.0 at 589 nm, inorganic dispersions are used in the range of 5 to 95% by volume and low viscosity high Tg organic binders are used in the range of 5 to 85% by volume. A blend or mixture of differing inorganic nanoparticles may also be utilized for achieving RI values above 1.6 such as a 50% $ZrO_2$/50% $TiO_2$ blend, or 75% $ZrO_2$/25% $TiO_2$ blend of the inorganic nanoparticles.

The optical performances of each P-NIL resin 100 were characterized by the following method. The P-NIL resin 100 was coated on 120 μm borosilicate glass, soft heated at 100° C. for 60 seconds, and cured with 30 $J/cm^2$ of 365 nm LED or UV-A light. The refractive index and film thickness were measured on a Metricon Model 2010M prism coupler at 25° C. at wavelengths of 457, 516, 638, and 854 nm, and the data was solved as a Cauchy function. Percent transmission, haze, and clarity were measured for the thin films coated on glass using a BYK haze-gard i instrument.

In one embodiment of a formulation of the P-NIL resin 100, an acrylate-based resin with an RI=1.60 at 589 nm was combined with coated 20 nm $TiO_2$ particles to obtain an RI=1.76 at 25° C. and 589 nm. The formulation comprised 40% by weight of the acrylate-based resin and 60% by weight $TiO_2$ particles. The Tg of this material was 63° C.

In another embodiment, the formulation was changed to 20% by weight acrylate-based resin and 80% by weight $TiO_2$ particles, resulting in a RI=1.82 of the cured formation at 589 nm and 25° C. The Tg of this formulation was 69° C.

Further examples of the P-NIL resin 100 and their optical performances are listed below.

PNIL-R Example 1

| Ingredients | % by volume |
| --- | --- |
| Photo cure acrylate example 1 | 0.85 |
| TiO$_2$ in propylene glycol methyl ether acetate dispersions from Pixelligent Technologies LLC | 0.15 |
| Formulation results: | |
| Viscosity of PNIL-R after evaporation of solvent, cps @ 25° C. | 450 |
| Refractive index of cured resin (589 nm, 25° C.) | 1.64 |
| Glass transition temperature of cured resin, Tg (° C.) | 61 |
| Haze of cured resin | 0.2% |
| Transmission of cured resin (not corrected for surface reflections) | 91% |
| Clarity of cured resin | 100% |

PNIL-R Example 2

| Ingredients | % by volume |
| --- | --- |
| Photo cure acrylate example 3 | 0.48 |
| TiO$_2$ in propylene glycol methyl ether acetate dispersions from Tayca Corp | 0.52 |
| Formulation results: | |
| Viscosity of PNIL-R after evaporation of solvent, cps @ 25° C. | 1,000 |
| Refractive index of cured resin (589 nm, 25° C.) | 1.85 |
| Glass transition temperature of cured resin, Tg (° C.) | 89 |
| Haze of cured resin | 0.3% |
| Transmission of cured resin (not corrected for surface reflections) | 88% |
| Clarity of cured resin | 100% |

PNIL-R Example 3

| Ingredients | % by volume |
| --- | --- |
| Photo cure epoxy example 1 | 0.85 |
| TiO$_2$ in propylene glycol methyl ether acetate dispersions from Tayca Corp | 0.15 |
| Formulation results: | |
| Viscosity of PNIL-R after evaporation of solvent, cps @ 25° C. | 500 |
| Refractive index of cured resin (589 nm, 25° C.) | 1.64 |
| Glass transition temperature of cured resin, Tg (° C.) | 70 |
| Haze of cured resin | 0.3% |
| Transmission of cured resin (not corrected for surface reflections) | 91% |
| Clarity of cured resin | 100% |

PNIL-R Example 4

| Ingredients | % by volume |
| --- | --- |
| Photo cure acrylate example 3 | 0.29 |
| TiO2 in propylene glycol methyl ether acetate dispersions from Pixilligent Technologies LLC | 0.71 |
| Formulation results: | |
| Viscosity of PNIL-R after evaporation of solvent, cps @ 25° C. | 100 |
| Refractive index of cured resin (589 nm, 25° C.) | 2.0 |
| Glass transition temperature of cured resin, Tg (° C.) | 65 |
| Haze of cured resin | 0.3% |
| Transmission of cured resin (not corrected for surface reflections) | 86% |
| Clarity of cured resin | 100% |

Reliability performances of PNIL-R were studied as follows. The P-NIL cured film coated on borosilicate glass was placed in an environmental stress chamber at 85° C. and 85% relative humidity. The coated samples were open to the atmosphere. After 1,100 hours, the coated samples were analyzed for percent transmission, haze, and clarity. Excellent optical properties were retained after 1,100 hrs at 85° C. and 85% relative humidity.

Examples of reliability performance results are summarized below:

PNIL-R Example 1

| | Time zero | 1,100 hours at 85° C./85% RH |
| --- | --- | --- |
| Transmission (%)*§ | 91 | 90 |
| Haze (%)* | 0.2 | 0.3 |
| Clarity (%)* | 100 | 100 |
| Visual observation | Optically clear, no cracks | Optically clear no cracks |

*1 micron film on glass
§no correction for surface reflection

PNIL-R Example 2

| | Time zero | 1,100 hours at 85° C./85% RH |
| --- | --- | --- |
| Transmission (%)*§ | 88 | 87 |
| Haze (%)* | 0.3 | 0.4 |
| Clarity (%)* | 100 | 100 |
| Visual observation | Optically clear, no cracks | Optically clear no cracks |

*1 micron film on glass
§no correction for surface reflection

What is claimed is:

1. A photo nanoimprint lithography (P-NIL) resin comprising:
    a cross-linkable organic binder;
    solvent based inorganic nanoparticles dispersed in the P-NIL resin; and
    a solvent configured to be evaporated;
    the P-NIL resin having a viscosity in the range of 4,000 to 6,000 centipoise at 25° C. after the solvent is evaporated prior to curing the P-NIL resin; and
    the P-NIL resin having a refractive index of greater than 1.6 at 589 nm and glass transition temperature of greater than 50° C. after curing by a photo initiator.

2. The P-NIL resin of claim 1, the cross-linkable organic binder reacts by photochemically induced radical polymerization or photochemically induced acid-catalyzed polymerization.

3. The P-NIL resin of claim 2, wherein the photo curable organic binder has viscosity in range of 2,000 to 5,000 cps at 25° C.

4. The P-NIL resin of claim 2, wherein the photo curable organic binder polymerizes to give a solid with a glass transition temperature of greater than 50° C.

5. The P-NIL resin of claim 2, wherein the solvent dispersion inorganic particles have particle size of less than 50 nm.

6. The P-NIL resin of claim 2, wherein the volume of the inorganic particles is in the range of 5-95% by volume.

7. The P-NIL resin of claim 2, wherein the photo curable organic binders are in the range of 5-85% by volume.

8. The P-NIL resin of claim 2, wherein the P-NIL resin is used for the manufacture of nano-patterning by using photo-, UV-, light-activate nanoimprint lithography manufacturing processes.

9. The P-NIL resin in claim 8, wherein the nano imprint layer thickness is in the range of 10 to 10,000 nm.

10. The P-NIL resin in claim 8, the P-NIL resin applied against a working stamp being light transmissible for photo curing, the working stamp chosen from the group consisting of polydimethyl silicone (PDMS), quartz, metal, and polymer.

11. The P-NIL resin in claim 8, the P-NIL resin applied on a substrate being light transmissible for photo curing, the working stamp chosen from the group consisting of polydimethyl silicone (PDMS), quartz, metal, and polymer.

12. The 2P resin of claim 2, wherein the photo curable organic binder has viscosity in range of 2,000 to 5,000 cps at 25° C.

13. The 2P resin of claim 12, wherein the organic compound polymerizes to give a solid with a glass transition temperature of greater than 50° C.

14. The 2P resin of claim 12, wherein the volume of the inorganic nanoparticles is in the range of 5-95% by volume.

15. The 2P resin of claim 12, wherein the organic compound are in the range of 5-85% by volume.

16. The P-NIL resin of claim 1, the cross-linkable organic binder reacts by photochemically induced radical polymerization, and wherein the photo curable organic binder comprises of monomers or oligomers with acrylate or methacrylate repeating units.

17. The P-NIL resin of claim 1, the cross-linkable organic binder reacts by photochemically induced acid-catalyzed polymerization, and wherein the photo curable organic binder comprises of monomers or oligomers with epoxy or oxetane repeating units.

18. A photo-polymer (2P) resin used in photo nanoimprint lithography for photonic and optical applications, the 2P resin comprising:
an organic compound;
inorganic nanoparticles less than 50 nanometers in size;
the organic compound having a minimum refractive index value of 1.5 and chosen from the group consisting of acrylate-based resin, epoxy-based resin, materials containing brominated aromatic compounds, and sulfur-containing compounds;
the inorganic nanoparticles having a minimum refractive index value of 1.6 at 589 nm chosen from the group consisting of silicon carbide, silicon nitride, zinc oxide, zirconium oxide, titanium oxide, and mixtures thereof;
wherein the organic compound and the inorganic nanoparticles are combined in a pre-polymerized liquid medium; and
wherein after a curing process a resultant cured material has a refractive index greater than or equal to 1.65 at 589 nm and a glass transition temperature greater than or equal to 50° C.

19. A method of producing a photo nanoimprint lithography (P-NIL) resin, the method comprising:
providing an uncured P-NIL resin consisting of a cross-linkable organic binder, solvent based inorganic nanoparticles dispersed in the uncured P-NIL resin, and a solvent having a viscosity in the range of 4,000 to 6,000 centipoise at 25° C.;
coating the uncured P-NIL resin on a substrate;
applying heat to the uncured P-NIL resin for solvent evaporation;
stamping the uncured P-NIL resin with a stamp having nanometer sized features;
curing the uncured P-NIL resin with a photo initiator; and
removing the stamp wherein the resultant P-NIL resin has a refractive index of greater than 1.6 at 589 nm, a glass transition temperature of greater than 50° C., and nanometer sized features.

20. The method of claim 19, the method further comprising
providing the uncured P-NIL resin without a solvent;
stamping the uncured P-NIL resin with a stamp having nanometer sized features;
curing the uncured P-NIL resin with a photo initiator; and
removing the stamp wherein the resultant P-NIL resin has a refractive index of greater than 1.6 at 589 nm, a glass transition temperature of greater than 50° C., and nanometer sized features.

\* \* \* \* \*